United States Patent
Ali

(10) Patent No.: US 8,339,161 B2
(45) Date of Patent: Dec. 25, 2012

(54) HIGH PERFORMANCE VOLTAGE BUFFERS WITH DISTORTION CANCELLATION

(75) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 47 days.

(21) Appl. No.: 12/498,903

(22) Filed: Jul. 7, 2009

(65) Prior Publication Data

US 2011/0006815 A1 Jan. 13, 2011

(51) Int. Cl.
*H03K 3/00* (2006.01)

(52) U.S. Cl. ........ 327/108; 327/112; 327/379; 327/427; 326/21; 326/82

(58) Field of Classification Search .......... 327/108–112, 327/379, 389–391, 427–432; 326/21–24, 326/26–27, 82–83, 87
See application file for complete search history.

(56) References Cited

U.S. PATENT DOCUMENTS

| | | | |
|---|---|---|---|
| 6,181,314 B1 * | 1/2001 | Nakajima et al. | 345/100 |
| 6,778,013 B1 | 8/2004 | Ali | |
| 7,119,584 B1 | 10/2006 | Ali | |
| 2009/0315594 A1 * | 12/2009 | Pentakota et al. | 327/109 |

* cited by examiner

*Primary Examiner* — Lincoln Donovan
*Assistant Examiner* — Shikha Goyal
(74) *Attorney, Agent, or Firm* — Kenyon & Kenyon LLP

(57) ABSTRACT

A voltage buffer may include a first signal path extending from an input terminal to an output terminal in which the first signal path further may include a buffer transistor that may have a control terminal, and a first and second current terminals responsive to the control terminal. In the first signal path, the control terminal may be connected to the input terminal, the first current terminal may be connected to the output terminal, and the first signal path may supply a load current to a load device responsive to an input signal at the input terminal. The voltage buffer further may include a second signal path extending from the input terminal to a current source node. The second signal path may include a replica load device. The voltage buffer further may include a current source supplying substantially constant current and coupled to the current source node. The voltage buffer further may include a current buffer positioned between the current source node and the output node in which the current buffer may direct a replica current from the second signal path responsive to the input signal and the substantially constant current from the current source to the buffer transistor.

21 Claims, 8 Drawing Sheets

Prior Art

HIGH PERFORMANCE VOLTAGE BUFFERS WITH DISTORTION CANCELLATION

FIELD OF THE INVENTION

The present invention is generally directed to voltage buffers. In particular, the present invention is directed to voltage buffers that use a replica circuit to reduce buffer distortions caused by variations in the load current.

BACKGROUND INFORMATION

Voltage buffers (such as emitter followers or source followers) are commonly used as an isolation buffer between upstream and downstream circuits. For example, voltage buffers may be used in sampler circuits to maintain good linearity of the output signal by isolating the input from the switching effects of the sampling switches. In theory, an ideal voltage buffer has characteristics of an infinite input impedance and zero output impedance over an infinite bandwidth to drive the downstream circuit. Thus, the voltage buffer may supply a load device a load current while keeping the output voltage fixed because of the very low output impedance.

However, in practice, voltage buffers may not have the perfect characteristics of an ideal voltage buffer due to various factors. For example, FIG. 1 shows an emitter follower 100 (the following discussion is similarly applicable to source followers). In the emitter follower, a transistor device 106 is connected to a bias current source 108 that supplies substantially constant current I and to a load device $Z_L$ 110. The output $V_{out}$ of the emitter follower is designed to follow the input $V_{in}$ 104 (possibly with an offset) when the output impedance from the transistor is small. In practice, transistor devices do not have the perfect characteristics as described above. Instead, the transfer function of the transistor 106 may have nonlinear components that may cause distortions in the output $V_{out}$ and thus degrade the voltage buffer's performance.

When the input signals include large AC components, the buffer bias current (i.e., current from the emitter to the collector of the transistor) may also vary from I, which may further cause variations in the current passing through the load devices $Z_L$ 110. The variations in the load current further may cause changes in parameters (such as transconductance) of the load device 110 and hence induce further nonlinearity in the voltage buffer output.

Conventionally, to reduce the nonlinearity, voltage buffers have been designed to have a bias current I significantly larger than the variable signal current supplied from the buffer to the load device. This may decrease the relative effect of the current variations and hence improve the buffer's linearity. However, a large bias current is associated with large DC power consumptions. Moreover, when the load device is capacitive in nature (such as a sample-and hold sampler circuit as shown in FIG. 2), the current supplied to the load device may increase with the signal frequency. Thus, the linearity of the buffer may suffer considerably at high frequencies despite a high bias current.

U.S. Pat. No. 6,778,013 (the '013 patent) and U.S. Pat. No. 7,119,584 (the '584 patent) to the same inventor describe a class of voltage buffers that use replica current generators generating replica load currents to compensate the current variations in the signal path of voltage buffers and thus counter the nonlinearity at the buffer output. The replica current generators disclosed in the '013 and '584 patents may include complex circuits that include an additional follower and at least one additional replica current source. Additionally, the complex replica generator circuits disclosed the '013 and '584 patents are slow to switch and consume additional powers.

Therefore, there is a need for an efficient solution to reduce the nonlinearity at the output of voltage buffers.

DETAILED DESCRIPTION

Embodiments of the present invention provide a voltage buffer which may include a first signal path extending from an input terminal to an output terminal in which the first signal path further may include a buffer transistor that may have a control terminal, and a first and second current terminals responsive to the control terminal. In the first signal path, the control terminal may be connected to the input terminal, the first current terminal may be connected to the output terminal, and the first signal path may supply a load current to a load device responsive to an input signal at the input terminal. The voltage buffer further may include a second signal path extending from the input terminal to a current source node. The second signal path may include a replica load device. The voltage buffer further may include a current source supplying substantially constant current and coupled to the current source node. The voltage buffer further may include a current buffer positioned between the current source node and the output node in which the current buffer may direct a replica current from the second signal path responsive to the input signal and the substantially constant current from the current source to the buffer transistor.

Figure 3:
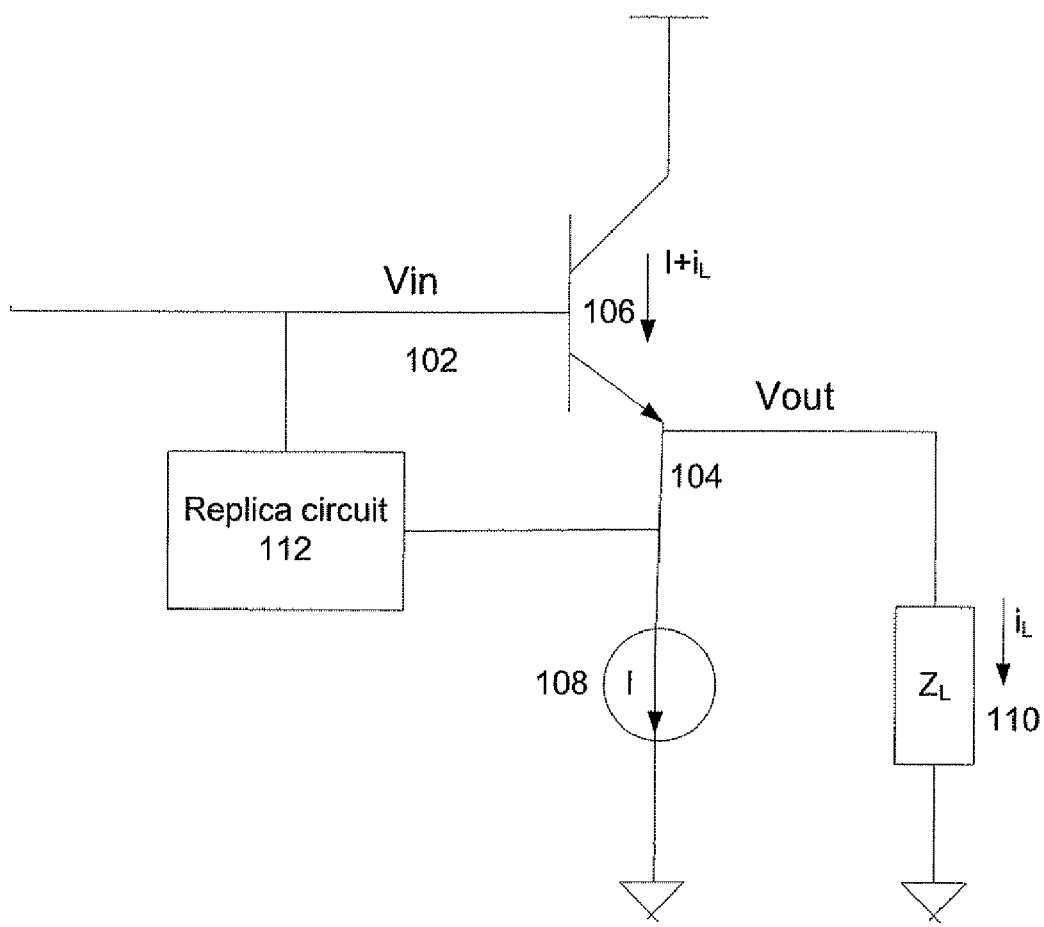
FIG. 3 is a schematic of a voltage buffer according to one embodiment of the present invention.

FIG. 3 shows a voltage buffer 300 according to one embodiment of the present invention. The voltage buffer 300 may drive a load device 110 via a voltage output $V_{out}$ at an output terminal 104 in response to a signal input $V_{in}$ at an input terminal 102. The voltage buffer 300 may include a buffer transistor 106, a current source 108, and a replica circuit 112. The base of the buffer transistor 106 may be coupled to the input terminal 102 while the emitter of the buffer transistor may be coupled to the output terminal 104 of the buffer transistor. The current source 108 may be coupled to the emitter (thus the output terminal) of the buffer transistor. A first end of the replica circuit 112 may be coupled to the input terminal 102, and a second end of the replica circuit may be coupled to the output terminal 104.

The current source 108 may supply a bias current I to the buffer transistor 106. The bias current I may have a substantially constant amplitude such as a DC current and provide an operation point for the buffer transistor. In response to an input signal $V_{in}$, the buffer transistor may act like an emitter follower and provide an AC load current $i_L$ to the load device 110. The replica circuit 112 may be configured to provide a second signal path from the input terminal 102 to the output terminal 104. The second signal path may supply a replica current substantially equal to the load current $i_L$ to compensate current variations in the bias current of the buffer transistor. Since the current source 108 may supply constant DC current I, the current injected from the second signal path via the replica circuit may be forced to fold up toward the output terminal 104 and the buffer transistor 106. Therefore, the current supplied to the buffer transistor may be substantially constant and equal to the bias current I of the current source 108 despite a draw of current $i_L$ from the load device 110.

Since the bias current of the buffer transistor may be kept substantially constant due to the compensational current from the second signal path via the replica circuit, the base-emitter voltage drop is also kept substantially constant. Thus, the output signal $V_{out}$ at the output terminal may follow the input signal $V_{in}$ (possibly with an offset) without much distortion caused by variations in the load current $i_L$. Even though the example of FIG. 3 illustrates an emitter follower using a single BJT transistor, such circuits may be realized using other types of transistor such as MOS type of transistors (or a source follower) and/or using more than one transistor such as using a differential pair of transistors. Therefore, the present invention accommodates other types of transistor devices or voltage buffers than those illustrated. Other types of transistors may include MOSFET type. Other types of voltage buffer may include differential type of voltage buffers and cascaded voltage buffers.

Figure 4:
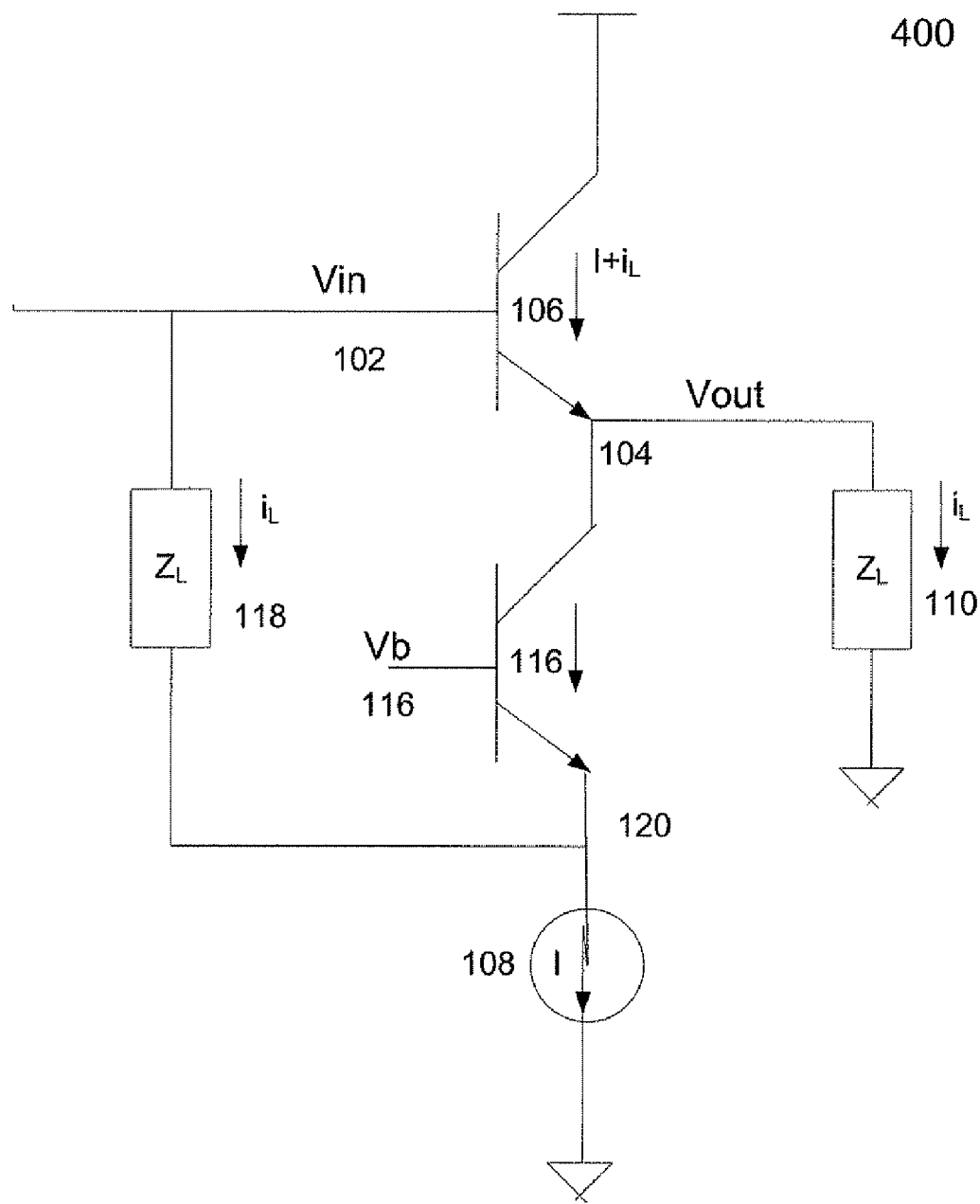
FIG. 4 is a schematic of the voltage buffer circuit according to one embodiment of the present invention.

FIG. 4 shows a voltage buffer that includes a replica circuit according to one embodiment of the present invention. In addition to components as shown in FIG. 3 (and labeled the same), the replica circuit further may include a cascode transistor 114 and a device matching to the load of the voltage buffer (hereinafter "replica load device") 118. The collector of the cascode transistor 114 may be coupled to the emitter of the buffer transistor 106. In one embodiment, the replica load device 118 may be coupled at a first end to the input terminal 102 and at a second end to the common note between the emitter of cascode transistor and the current source 108.

The base of the cascode transistor 114 may be coupled to a bias potential $V_b$, which may cause the cascode transistor to act as a current buffer that has a substantially unit gain for current between its emitter and collector. The bias $V_b$ may be set to a level which may cause the cascode transistor to operate in an active state and a MOS transistor for the current source 108 is in a saturated state (see further explanation below for FIG. 5). The replica load device 118 may be a device that is the same as or substantially similar to the load device 110. For example, if the load device 110 is a capacitor with a capacitive impedance of $Z_L$, the replica load device 118 also may be a capacitor with a capacitive impedance of $Z_L$ or approximately $Z_L$. In an alternative embodiment, the load device may be a capacitor having a capacitance of $C_L$ (not shown).

Referring to FIG. 4, the input signal such as an analog signal $V_{in}$ at the input terminal 102 may drive two signal paths. Through the first signal path, $V_{in}$ may drive the load device 110 via the buffer transistor 106 and supply a load current $i_L$ to the load device. Through the second signal path, $V_{in}$ may be directly applied to the replica load device 118 and supplies a current approximately $i_L$ through the replica load device to a current source node 120. The current $i_L$ from the replica load device 118 may be injected into the cascode transistor 114 (i.e., the current buffer) toward the voltage buffer 106 through the current source node 120.

Accordingly, the folded up current $i_L$ may compensate current variations (caused by the load device 110) in the voltage buffer 106 so that the buffer transistor may maintain the bias current for the voltage buffer substantially constant at I. This may significantly improve the linearity of the voltage buffer without significantly increasing the complexity of the voltage buffer circuit or power consumption.

In one embodiment of the present invention, the parameters of the replica load device may be limited by other factors. For example, under certain scenarios, the capacitance of the replica load device 118 may not be as high as that of the load device 110 because of limiting factors such as the bandwidth requirement at the input. If so, the parameters of the replica load device may be chosen as the closest to the parameters of the load device within the requirement of the limiting factor. For example, the capacitance of the replica load may be set to a high level which do not violate the bandwidth requirement. In such a situation, the replica current injected from the replica load device to the cascode transistor may not be the same or substantially the same as the load current $i_L$. However, the injected current still may partially compensate for the current variations caused by the load device in the buffer transistor 104 and significantly improve the linearity of the voltage buffer.

Figure 5:
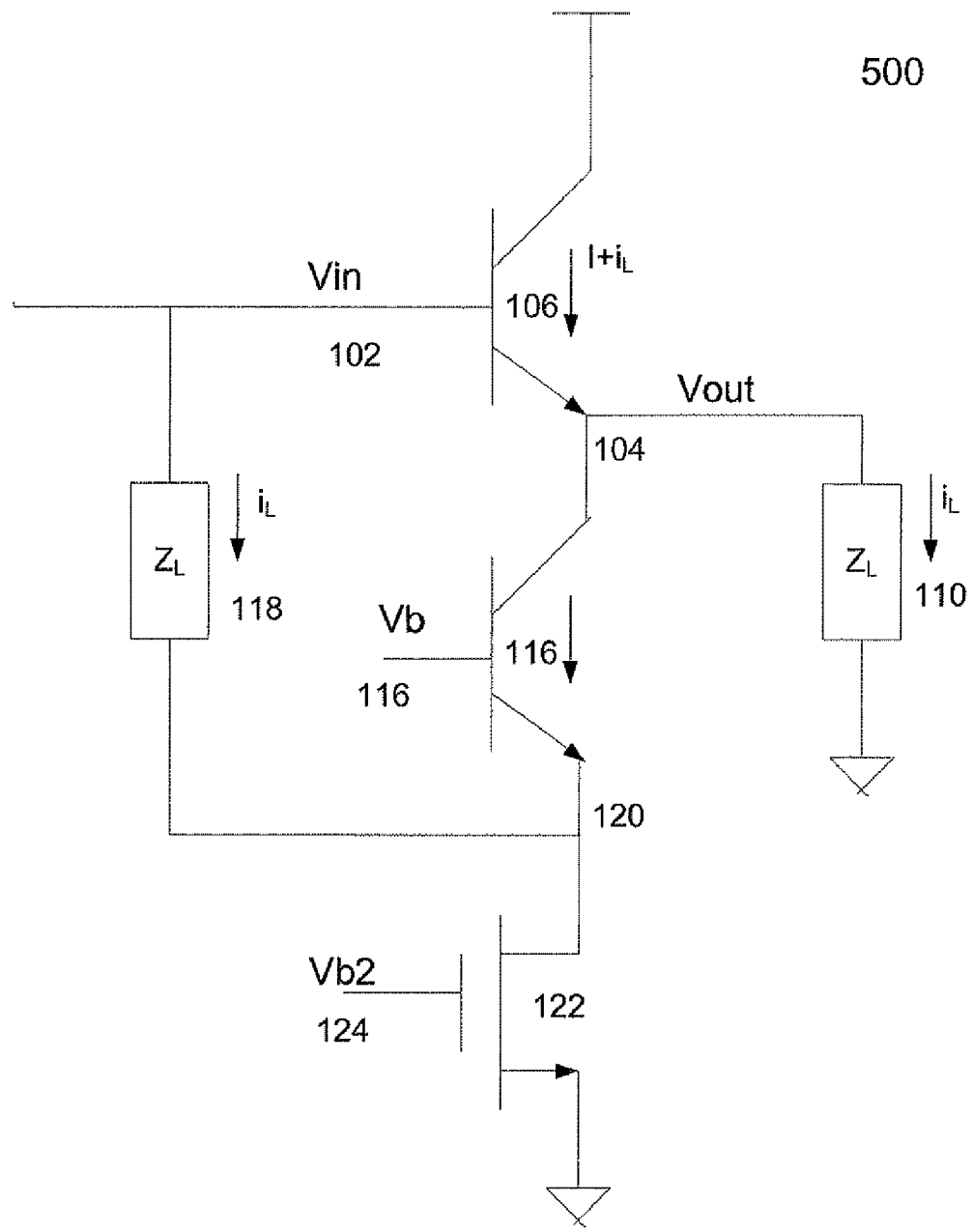
FIG. 5 is a schematic of the voltage buffer circuit according to another embodiment of the present invention.

FIG. 5 shows a voltage buffer according to one embodiment of the present invention.

Referring to FIG. 5, the current source 108 of FIG. 4 may be implemented using a MOS transistor 122. The drain of transistor 122 may be coupled to the common node 120. A bias voltage $V_{b2}$ may be provided to the gate of transistor 122. For this embodiment, the bias voltage $V_{b2}$ may be set to a potential level which causes transistor 122 to operate in a saturated state and supply substantially constant bias current I. Thus, in connection with previous discussion, $V_b$ may be set to a potential level that has enough headroom for the cascode transistor 114 to operate in an active state and for the current source transistor 122 to operate in a saturated state to provide substantially constant current I.

Figure 6:
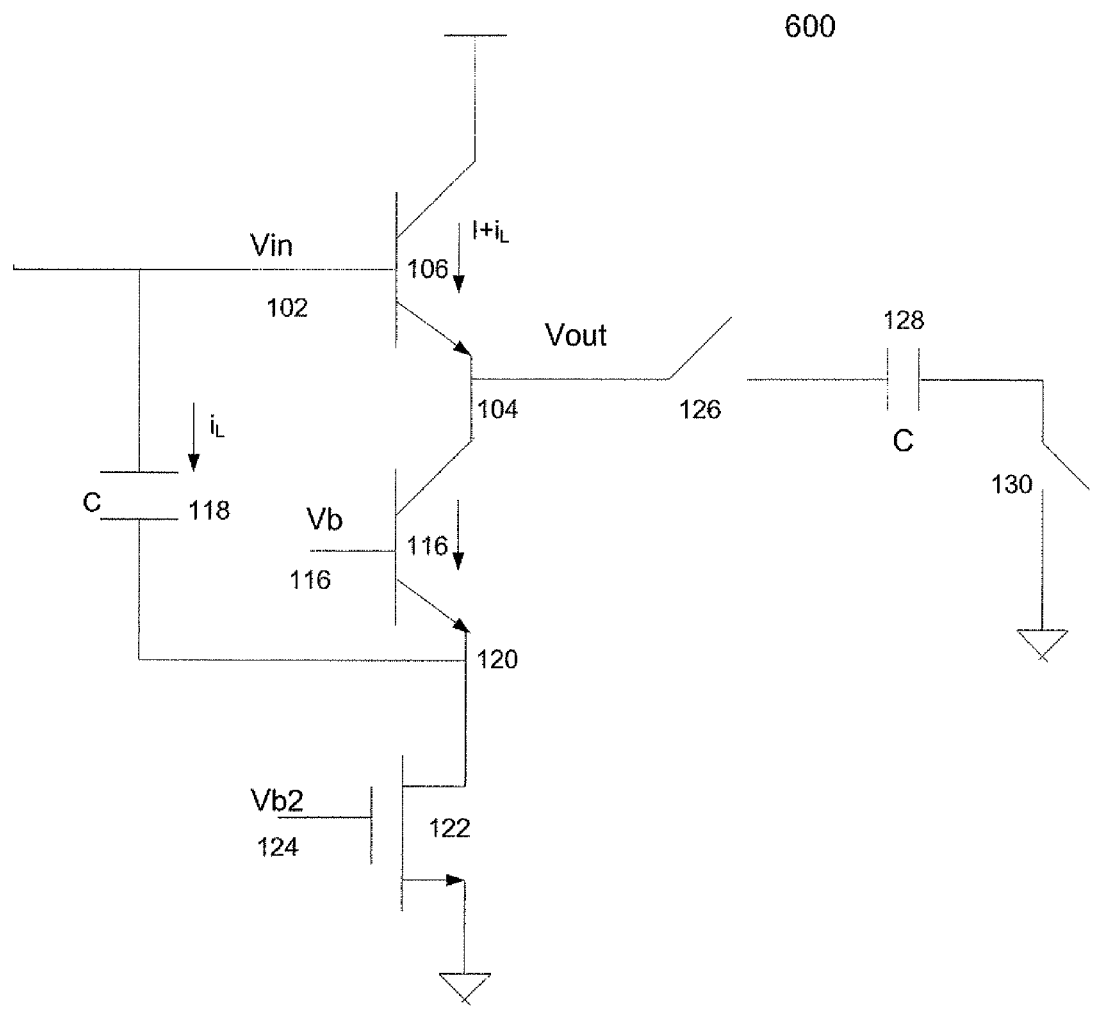
FIG. 6 is a circuit schematic of the voltage buffer circuit as used in connection with a sampler circuit according to one embodiment of the present invention.

FIG. 6 shows a voltage buffer as used in a sampler circuit according to one embodiment of the present invention. A sample-and-hold circuit as a load device may be coupled to the voltage buffer. The sample-and-hold sampler may include a first switch 124, a second switch 128, and a capacitor load device 126. The first switch 124 may be coupled to the output terminal 104 of the voltage buffer and a first end of the capacitor load device 126. A second end of the capacitor load device 126 may be coupled to the second switch 128. Since the load device is a capacitor, the replica load device also may be a capacitor whose capacitance is substantially equal to that of the capacitor load device.

In operation, the first and second switches may operate asynchronously—that is, when the first switch is closed, the second switch is open, and vice versa. When the first switch is closed (and the second switch is open), the voltage buffer may charge the capacitor load device 126 with the load current $i_L$ to a charged mode. When the first switch is open (and the second switch is closed), the capacitor load device may be discharged through the closed second switch to a discharged mode. During charging, despite the variations of charging current $i_L$, the current passing through the buffer transistor may be maintained substantially equal to I because of the current injected from the second signal path via the replica circuit.

In an alternative embodiment of the present invention, the second signal path that includes the replica capacitor 118 also may include a first and second switches (not shown) that respectively match the switches 126, 130. The first switch may be coupled between $V_{in}$ and the replica capacitor 118, and the second switch may be coupled between the replica capacitor 118 and the common node 120. In operation, the first switch may be in sync with switch 126, and the second switch may be in sync with switch 130. In this way, the second signal path may mimic the operation of the load at $V_{out}$.

Therefore, embodiments of voltage buffers according to the present invention may reduce the nonlinearity or distortions in the main signal path at the output of the voltage buffer by reducing current variations in the buffer transistor through injecting a replica current that may be substantially equal to the load current via a separate signal path to the buffer transistor.

Figure 7:
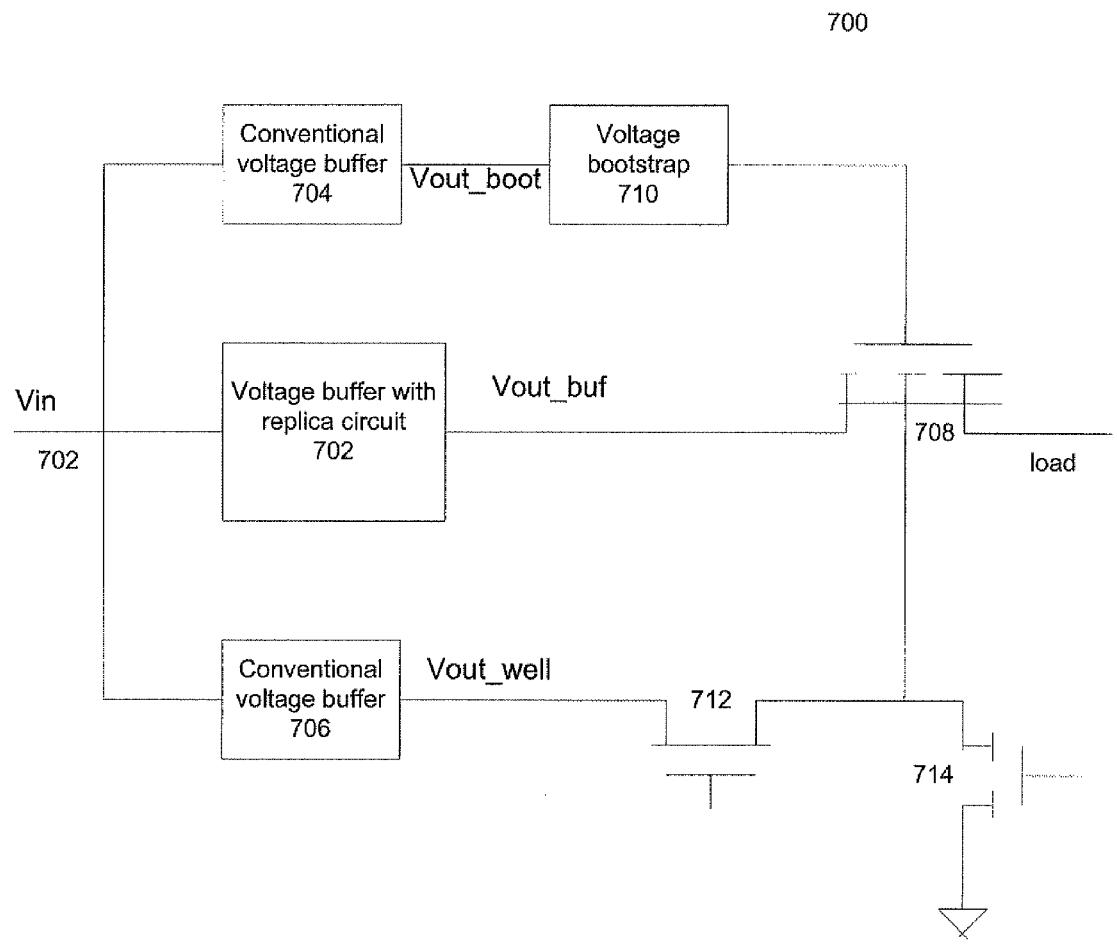
FIG. 7 is a schematic of an embodiment of the voltage buffer as used along with two other voltage buffers in a sampler circuit according to one embodiment of the present invention.

FIG. 7 shows another voltage buffer as used in a sampler circuit according to one embodiment of the present invention. The sampler circuit 700, at the input stage, may include an upper voltage buffer 704, a mid voltage buffer 702, and a lower voltage buffer 706. The sampler circuit, at a second stage, further may include a first switch transistor 708, a voltage bootstrap circuit 710, a current buffer transistor 712, and a second switch 714. The output of the switch transistor 714 may be coupled to a load device (not shown). The input terminals of voltage buffers 702, 704, 706 may respectively be coupled to a single input signal $V_{in}$. The output of the mid voltage buffer 702 may be coupled to the source of the switch transistor 708—i.e., a signal path from the source to the drain of the switch transistor 708. The drain of the switch transistor may be coupled to a load device such as a capacitor. The output of the upper buffer 704 may be coupled to a voltage bootstrap circuit whose output may be coupled to the gate of the switch transistor 708. The output of the lower buffer 706 may be coupled to the drain of the current buffer transistor 712 whose source may be coupled to a back gate of the switch transistor 708.

In one embodiment of the present invention, the upper and the lower voltage buffers 704, 710 may be conventional voltage buffer circuits—i.e., voltage buffers without replica circuits, while the mid voltage may be a voltage buffer with the replica circuit as provided in the context of the present invention. In operation, the front gate may be connected to the bootstrap voltage (i.e., $V_{in}$ plus a DC voltage) during sampling phase and to ground during the hold phase. The back gate may be connected to $V_{in}$ or a buffered version of $V_{in}$ during the sampling phase and to ground during the hold phase. Thus, the switch transistor 708 may be open during the sampling phase and be closed during the hold phase. Therefore, the upper and lower voltage buffers 704, 706 may be implemented without the replica circuit since they are not in the main signal path of the sampler, and the mid voltage buffer 702 may be implemented with replica circuit for improved linearity. The selective implementation of voltage buffers based on whether they are in the signal path or not may simplify the design, improve performance and lower power consumption of the sampler circuit.

Figure 1:
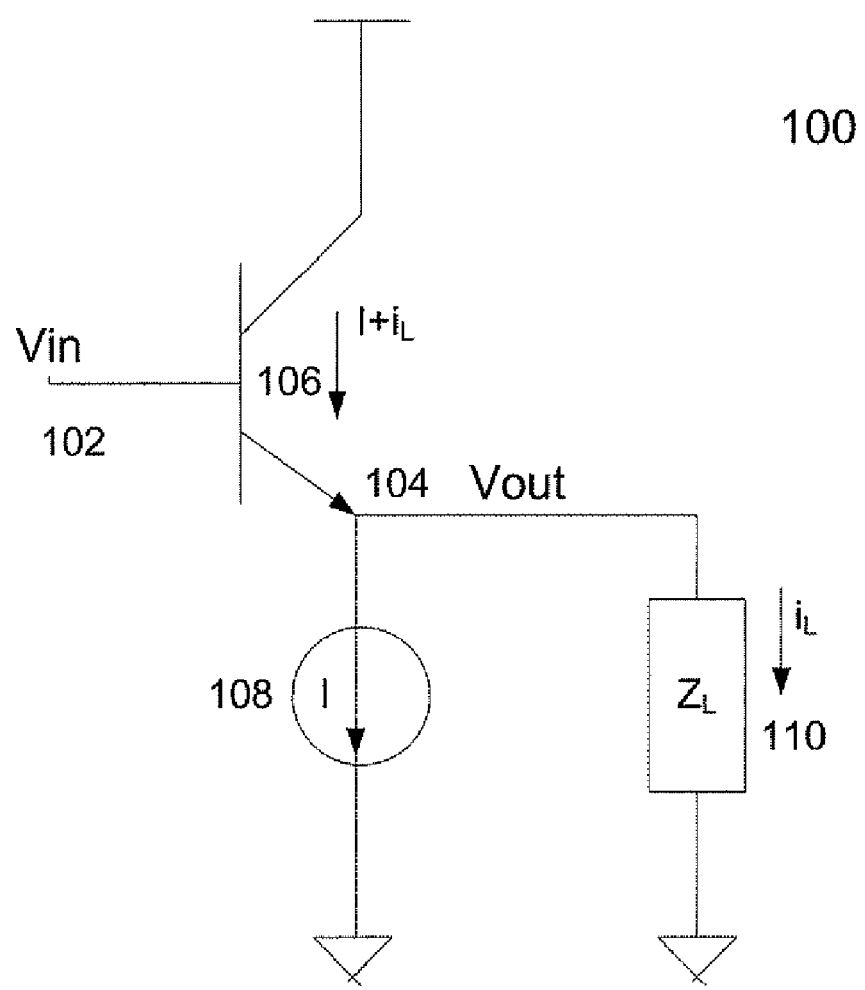
FIG. 1 is a schematic of a conventional voltage buffer.
Figure 2:
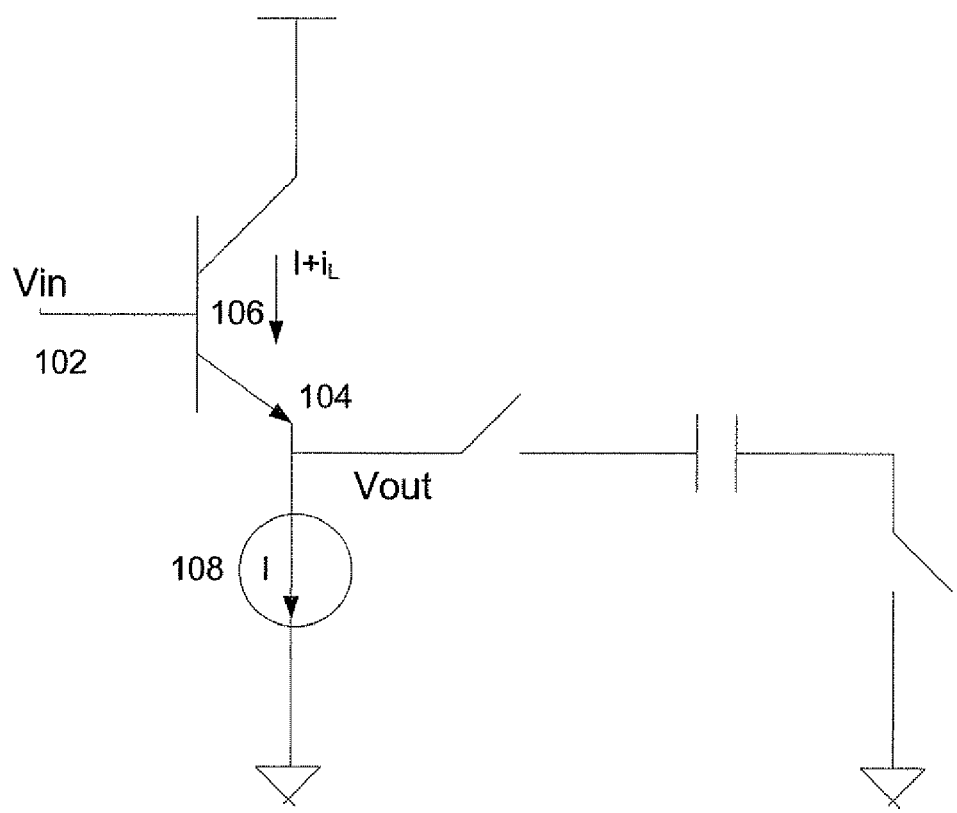
FIG. 2 is a schematic of a conventional voltage buffer as used in connection with a sampler circuit.
Figure 8:
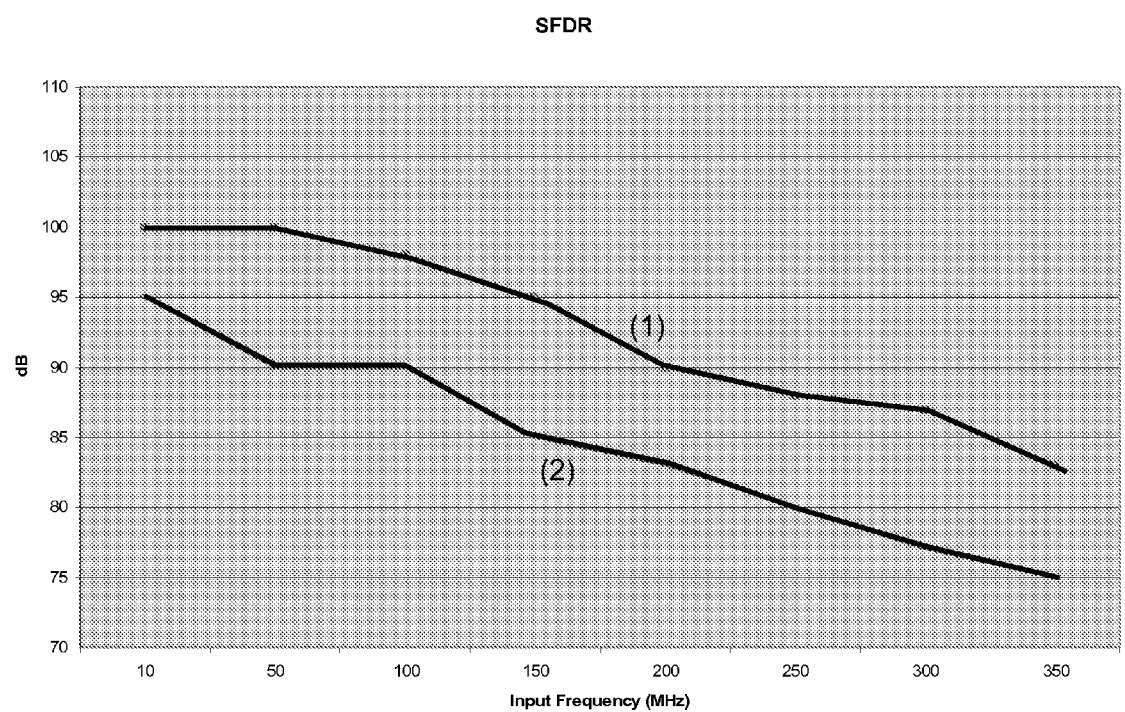
FIG. 8 is a Spurious-Free Dynamic Range (SFDR) chart comparing a voltage buffer according to the present invention against a prior art voltage buffer.

FIG. 8 shows a spurious-free dynamic range (SFDR) chart of one voltage buffer according to one embodiment of the present invention as compared to a conventional buffer. The circuits are a sample-and-hold sampler using (1) a voltage buffer as disclosed in the present application and (2) a conventional voltage buffer as shown in FIG. 1. The input signal has a peak-to-peak voltage 2V. The sampler is sampled at 125 MS/s. As shown in FIG. 8, the sampler using the voltage buffer as disclosed in the present application may improve the SFDR by about 6 to 8 dB while reducing the power consumption by about 60% based on a simulation study.

Those skilled in the art may appreciate from the foregoing description that the present invention may be implemented in a variety of forms, and that the various embodiments may be implemented alone or in combination. For example, even though the transistors in the voltage buffer may be illustrated with the bipolar type, the transistors may not be limited to bipolar type and may be implemented in other types of transistors such as a MOS type of transistors in the present invention. The voltage buffer of the present invention may also be implemented in other forms. For example, voltage buffers according to the present invention may be of differential type or may be cascaded at multiple stages. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A voltage buffer, comprising:
   a first signal path extending from an input terminal to an output terminal, the first signal path including a buffer transistor, the buffer transistor having a control terminal, a first and second current terminals responsive to the control terminal, wherein the control terminal is coupled to the input terminal and the first current terminal is coupled to the output terminal, and wherein the first signal path supplies a load current to a load device responsive to an input signal at the input terminal;
   a second signal path extending from the input terminal to a current source node, the second signal path including a replica load device of the load device;
   a current source supplying substantially constant current and being coupled to the current source node; and
   a current buffer coupled between the current source node and the output node, wherein the current buffer directs a replica load current from the second signal path responsive to the input signal and the substantially constant current from the current source to the buffer transistor.

2. The voltage buffer of claim 1, wherein the load device is a capacitor and the replica load device is another capacitor the capacitance of which is substantially equal to the load device.

3. The voltage buffer of claim 1, wherein the load device is a capacitor and the replica load device is another capacitor the capacitance of which is the largest capacitance allowed under an input bandwidth constraint.

4. The voltage buffer of claim 1, wherein the second signal path includes only the replica load device.

5. The voltage buffer of claim 1, wherein the current buffer is a transistor having a control terminal and a first and second current terminals, wherein:
   the first current terminal of the transistor is coupled to the current node,
   the second current terminal of the transistor is coupled to the output node, and
   a bias voltage applied to the control terminal of the transistor keeps the transistor operating in an active region of a transfer function of the transistor.

6. The voltage buffer of claim 1, wherein the current source is a MOS transistor that operates at a substantially saturated state.

7. A voltage buffer, comprising:
   a buffer transistor having a control terminal, a first and second current terminals responsive to the control terminal, wherein the control terminal of the buffer transistor is coupled to an input signal, and wherein the first current terminal of the buffer transistor supplies a load device current to a load device responsive to the input signal;

a replica load device approximating a load of the load device and having a first and second end; a current source supplying a substantially constant current; and a current buffer having a first and second end, wherein:

the first end of the replica load device is coupled to the control terminal of the buffer transistor;

the second end of the replica load device and the current source are coupled to the first end of the current buffer;

the second end of the current buffer is coupled to the first current terminal of the buffer transistor.

8. The voltage buffer of claim 7, wherein the load device is a capacitor and the replica load device is another capacitor the capacitance of which is substantially equal to the load device.

9. The voltage buffer of claim 7, wherein the load device is a capacitor and the replica load device is another capacitor the capacitance of which is the largest capacitance allowed under an input bandwidth constraint.

10. The voltage buffer of claim 7, wherein the replica load device includes only a single capacitor.

11. The voltage buffer of claim 7, wherein the current buffer is a transistor having a control terminal and a first and second current terminals, wherein:

the first current terminal of the transistor is coupled to the second end of the replica load device and the current source, the second current terminal of the transistor is coupled to the first current terminal of the buffer transistor, and a bias voltage applied to the control terminal of the transistor keeps the transistor operating in an active region of a transfer function of the transistor.

12. The voltage buffer of claim 7, wherein the current source is a MOS transistor that operates at a substantially saturated state.

13. A sampler for providing samples of an analog signal, comprising:

a load capacitor;

a buffer transistor having a control terminal, a first and second current terminals responsive to the control terminal, wherein the control terminal receives the analog signal, and wherein the first current terminal supplies a load current to the load capacitor in a first mode and isolates the load capacitor from the analog signal in a second mode;

a replica load capacitor that replicates a capacitance of the load capacitor, wherein the replica load capacitor is coupled to the control terminal of the buffer transistor, and the analog signal drives a replica load current through the replica load capacitor;

a current source supplying a substantially constant current; and a current buffer, wherein the current buffer is coupled to the replica load capacitor and the current source, and directs the replica load current and a current from the current source to the first terminal of the buffer transistor.

14. The sampler of claim 13, wherein a first switch is coupled between the load capacitor and the buffer transistor, and wherein the on and off of the first switch determines respective the first and second modes.

15. The sampler of claim 13, wherein a capacitance of the replica load capacitor is substantially equal to a capacitance of the load capacitor.

16. The sampler of claim 13, wherein a capacitance of the replica load capacitor is the largest allowed capacitance under an input bandwidth constraint.

17. The sampler of claim 13, wherein the current buffer is a transistor having a control terminal and a first and second current terminals, wherein:

the first current terminal of the transistor is coupled to the second end of the replica load capacitor and the current source, the second current terminal of the transistor is coupled to the first current terminal of the buffer transistor, and a bias voltage applied to the control terminal of the transistor keeps the transistor operating in an active region of a transfer function of the transistor.

18. The voltage buffer of claim 13, wherein the current source is a MOS transistor that operates at a substantially saturated state.

19. The voltage buffer of claim 1 wherein a first end of the replica load device is directly coupled to the input terminal and a second end of the replica load device is directly coupled to the current source node.

20. The voltage buffer of claim 7, wherein the first end of the replica load device is directly coupled to the control terminal of the buffer transistor, and the second end of the replica load device is directly coupled to the first end of the current buffer.

21. The sampler of claim 13, wherein a first end of the replica load capacitor is directly coupled to an input terminal and a second end of the replica load capacitor is directly coupled to a current source node.

\* \* \* \* \*